United States Patent [19]

Hamada

[11] Patent Number: 5,739,671
[45] Date of Patent: Apr. 14, 1998

[54] DEVICE FOR ACCURATE DETECTION OF REMAINING DISCHARGE CAPACITIES OF A PLURALITY OF BATTERIES

[75] Inventor: Ken Hamada, Kariya, Japan

[73] Assignee: Nippondenso Co., Ltd., Kariya, Japan

[21] Appl. No.: 647,657

[22] Filed: May 15, 1996

[30] Foreign Application Priority Data

May 15, 1995 [JP] Japan ................................. 7-115748

[51] Int. Cl.⁶ ............................ H01M 10/46; H01M 10/48
[52] U.S. Cl. .................................................. 320/15; 320/48
[58] Field of Search ................................ 320/5, 6, 14, 15, 320/18, 22, 30, 31, 32, 35, 39, 43, 44, 48; 324/427, 431, 433

[56] References Cited

U.S. PATENT DOCUMENTS

| | | | |
|---|---|---|---|
| 4,949,046 | 8/1990 | Seyfang | 324/427 |
| 5,043,651 | 8/1991 | Tamura | 320/43 |
| 5,057,762 | 10/1991 | Goedken et al. | 320/15 |
| 5,206,578 | 4/1993 | Nor | 320/18 X |
| 5,321,627 | 6/1994 | Retter | 320/48 X |
| 5,387,857 | 2/1995 | Honda et al. | 320/18 |
| 5,404,106 | 4/1995 | Matsuda | 324/431 |
| 5,493,197 | 2/1996 | Eguchi et al. | 320/5 |
| 5,504,415 | 4/1996 | Podrazhansky et al. | 320/18 |
| 5,565,759 | 10/1996 | Dunstan | 320/48 |
| 5,592,094 | 1/1997 | Ichikawa | 320/48 X |

FOREIGN PATENT DOCUMENTS

| | | |
|---|---|---|
| 61-22912 | 6/1986 | Japan. |
| 62-173077 | 11/1987 | Japan. |
| 2-136445 | 11/1990 | Japan. |
| 4-299032 | 10/1992 | Japan. |
| 5-15076 | 1/1993 | Japan. |
| 5-64377 | 3/1993 | Japan. |
| 6-133465 | 5/1994 | Japan. |
| 6-141479 | 5/1994 | Japan. |

Primary Examiner—Edward Tso
Attorney, Agent, or Firm—Cushman, Darby & Cushman IP Group of Pillsbury, Madison & Sutro LLP

[57] ABSTRACT

A charge state detecting device has a battery device including a plurality of batteries connected in series, a current sensor which detects a current flowing from the battery device, and a voltage sensor which detects the voltage of each of the batteries. A main controller calculates a correlation between discharge current and battery voltage, and provides an estimated voltage of each battery of the batteries under a constant energy discharge, based on the correlation. The estimated voltages for the batteries are used for deriving the capacity of each battery with reference to a voltage-capacity characteristic, which is stored in advance. The main controller supplies to a display indicator the minimum one of the derived capacities to warn of an impending need to charge the batteries.

20 Claims, 6 Drawing Sheets

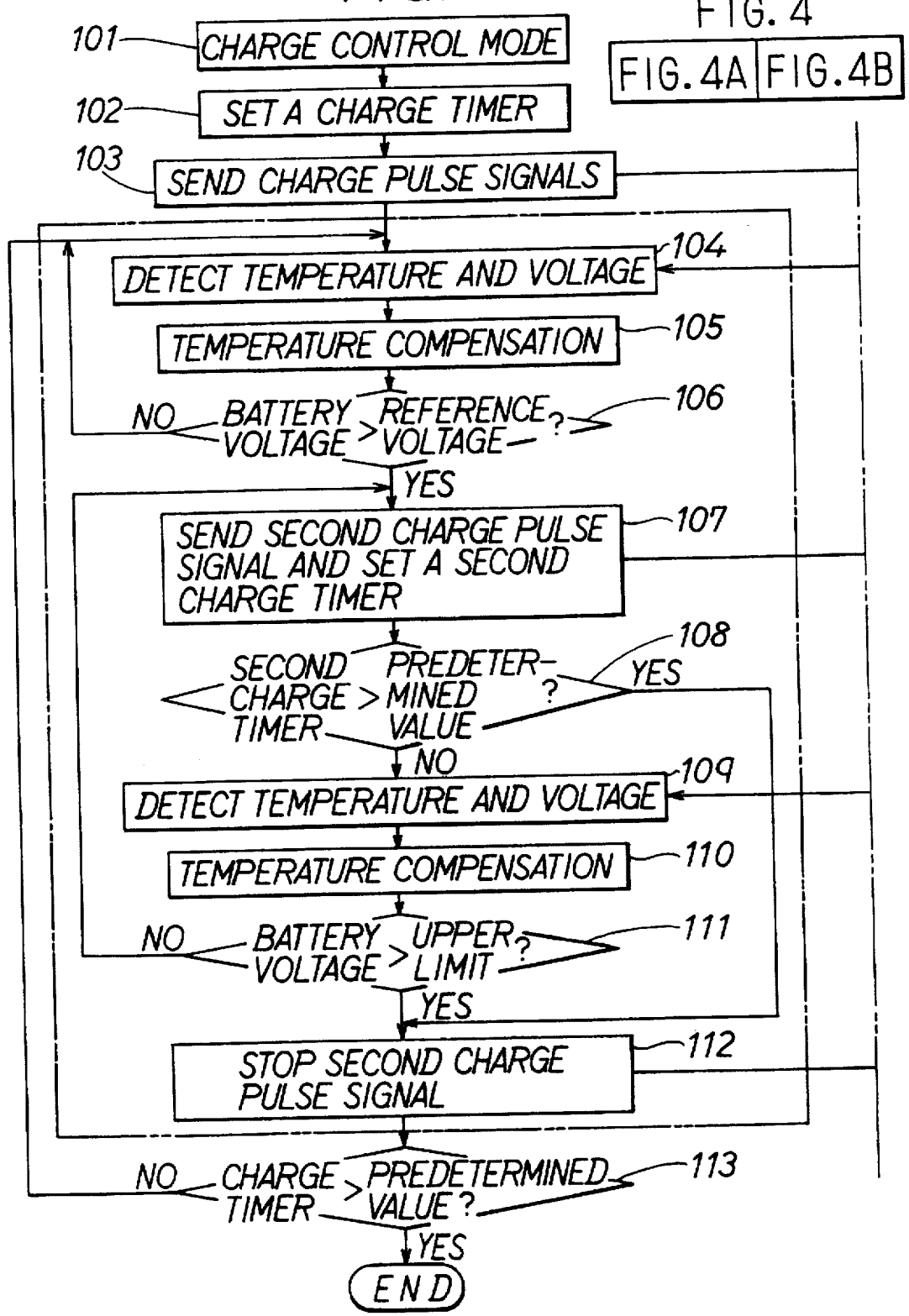

DEVICE FOR ACCURATE DETECTION OF REMAINING DISCHARGE CAPACITIES OF A PLURALITY OF BATTERIES

CROSS REFERENCE TO RELATED APPLICATION

This application is based upon and claims priority from Japanese Patent Application No. Hei 7-115748 filed May 15, 1995, the contents of which are incorporated herein by reference.

BACKGROUND OF THE INVENTION

1. Field of the Invention

The present invention relates to a charge state detecting device for a battery device including a plurality of batteries connected in series.

2. Related Art

In an electric motor vehicle, a predetermined voltage for supplying the electric motor is generated by connecting a plurality of batteries in series. Each of the batteries is formed from rechargeable battery cells. However, even if batteries of the same type are employed, battery characteristics, such as capacitance and internal resistance, are hardly identical. As a result, even when the batteries are charged and discharged repeatedly under the same condition, a certain battery may be overcharged, the other battery may be overdischarged, causing the lifetime of the batteries to shorten.

Japanese Patent Application Laid-Open No. Hei 6-141479 discloses that charge and discharge of batteries are forcibly stopped when a voltage difference between a pair of batteries exceeds a predetermined value. As also disclosed therein, when there is just a pair of batteries in a battery device, detecting the voltage difference therebetween is relatively easy. The possibility of, for example, being overdischarged can be determined as a function of the voltage difference. However, when more than two batteries are employed, it is difficult to determine an overdischarge with regard to each of the batteries based on voltage differences among them. Thus, discharges from the batteries might be erroneously continued in spite of the fact that any one or more of the batteries have been fully discharged.

Japanese Utility Model Application Laid-Open No. Hei 2-136445 discloses that voltage generated at each battery is detected; a battery charge is stopped when any one of the detected voltages has reached a charge stop voltage and a battery discharge is stopped when any one of the detected voltages has dropped to a discharge stop voltage. However, since an overcharge and an overdischarge are determined based on the detected voltages, an accurate determination of being overcharged or overdischarged cannot be made. That is, a voltage value of a battery varies depending on, for example, temperature. Therefore, the voltage value does not accurately show a capacity to supply an electric power to an electric load. In addition, when batteries are used for an electric motor vehicle, it is not preferable that discharges from the batteries are stopped when one of the batteries drops to a predetermined voltage. That is because, if operated in that manner, an electric motor vehicle will come to a sudden stop regardless of the place where the electric motor vehicle is running.

Japanese Patent Application Laid-Open No. Hei 5-64377 and family member U.S. Pat. No. 5,387,857 disclose that voltage generated at each battery is detected, and the charge currents flowing to the batteries are stopped when any one of the detected voltages have reached a full-charged voltage. Since the charge currents are stopped when a predetermined condition is fulfilled, overcharges in the batteries will not occur. However, the batteries which run short of charge are left as they are. In addition, as described as one of the disadvantages of the device disclosed by the Japanese Utility Model application Laid-Open No. Hei 2-136445, a voltage value of a battery does not accurately show the electric power supplying capacity left in the battery.

Japanese Patent application Laid-Open No. Hei 6-133465 discloses that after any one of the batteries has reached a predetermined voltage, the charge for the batteries connected in series is continued with a reduced current so that the voltage of the battery having the predetermined voltage will not go up higher and the reminder of the batteries will approach the predetermined voltage.

Japanese Patent Application Laid-Open No. Hei 4-299032 and family member disclose that when at least one of the batteries becomes a full charge, supplying of a charge current to the batteries will be stopped.

Japanese Utility Model Application Laid-Open No. Sho 62-173077 discloses that the respective voltages of the batteries are compared with predetermined voltage values and if at least one of the voltages is lower than the predetermined voltage value, a warning circuit will be energized.

Japanese Examined Patent Application No. Sho 61-22912 discloses that the respective voltages of the batteries are changed to voltage values that show how far they are from the same standard voltage, after that, the changed voltage values are compared with predetermined voltage values to determine the overdischarge.

Japanese Patent Application Laid-Open No. Hei 5-15076 discloses that after the batteries are completely discharged so that the capacity of the each battery becomes approximately equal, the batteries are charged by a power source.

As is apparent, none of the prior art described above copes with the need to know the remaining power supplying capacity of the one battery which has the least power supplying capacity among a plurality of series-connected batteries.

SUMMARY OF THE INVENTION

The present invention is made in light of the foregoing problems, and it is an object of the present invention to provide a precise determination of an electric power supplying capacity left in the battery which has the least power supplying capacity among the batteries in a battery device.

It is an another object of the present invention to provide a proper charge to each battery regardless of the charge state of each of the other batteries and preventing overcharge of any battery in the battery device.

For attaining the first object, an exemplary device according to the present invention has a battery device including a plurality of batteries connected in series, a current detection device which detects a current flowing from the battery device, and a voltage detection device which detects the voltage of each of the batteries. The exemplary device further includes a capacity calculating device for calculating an electric power supplying capacity of each battery from the discharge currents and the discharge voltages of the batteries, and a capacity determination device for determining a minimum capacity among the calculated capacities.

The capacity calculating device calculates a current-voltage regression formula, which shows a correlation relationship between a discharge current and a discharge voltage, based on plural data of the discharge currents and the discharge voltages, and provides an estimated voltage for each of the batteries under a constant energy discharge, based on the current-voltage regression formula. The estimated voltages are used for deriving the respective capacities of the batteries with reference to a voltage-capacity characteristic, which is stored in advance.

Since the capacities of all of the batteries are calculated and a minimum capacity among the calculated capacities is determined, it can be accurately determined whether a battery device is able to continue supplying an electrical power to an electric load without any battery being damaged.

When a battery device is used with an electric motor vehicle, it is preferable for an exemplary device to include a detectable signal producing device for producing a detectable signal which indicates at least when one of the batteries reaches a predetermined minimum desired energy supplying capacity. Such a signal may energize a warning light and/or a voice generator which provides a voice warning. Alternatively, the signal may be a continuous one which represents the energy supplying capacity of whichever battery currently has the least energy supplying capacity. Such a continuous signal may be applied to a gauge for continuously displaying the current capacity of the battery supplying the least energy, and the gauge itself can have a red-warning area for indicating when the capacity of the least energy supplying battery reaches the predetermined minimum-desired energy supplying capacity. Since the driver can be informed by one of the warning methods that a battery has reached the predetermined minimum-desired energy supplying capacity, the driver can take a remedial measure such as recharging the battery device before any of its batteries is overdischarged.

The exemplary device may further include an average capacity calculating device for calculating an average capacity of all batteries and a deterioration determination device for determining the deterioration of a battery when its capacity is smaller by a predetermined value than the average capacity.

In the exemplary device, the batteries are individually charged by corresponding charge circuits. Thus, none of the batteries is overcharged. It is preferable that each battery is charged with relatively large constant current until each battery voltage reaches a predetermined value and, after that, with relatively small constant current. By charging with two kinds of constant currents, the batteries can be not only charged rapidly and without energy loss but also prevented from being overcharged.

When a battery device is connected to a power source for charging purposes, the period of time for charging each battery may be controlled so that the energy which is necessary to charge a battery device does not exceed the maximum energy of the power source. For example, the timing at which each battery begins to be charged is shifted from one to another, or staggered individually or in groups, or in any desired manner so that at no time are all of the time periods for charging the batteries overlapping.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 4 is a combination of FIGS. 4A and 4B;

FIG. 4A is a flow chart illustrating the process performed by the main CPU of FIG. 1 when a battery device is charged;

DETAILED DESCRIPTION OF THE PREFERRED EMBODIMENTS

Figure 1:
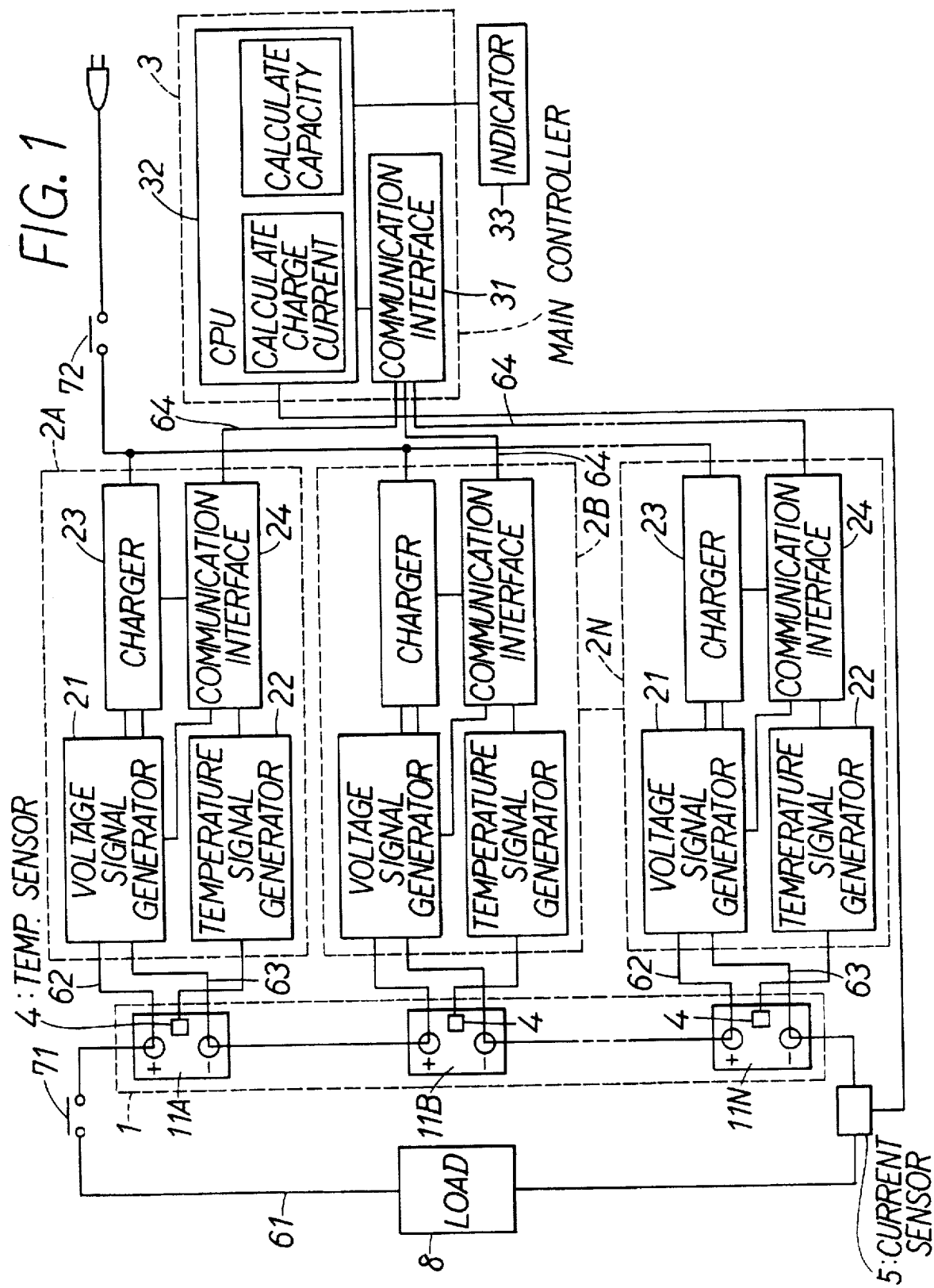
FIG. 1 is a block diagram illustrating a charge state controlling device according to the present invention.

A preferred embodiment of a charge state detecting device of the present invention is now described in detail with reference to FIGS. 1 to 7. In FIG. 1, a battery device 1 for an electric motor vehicle is constructed by connecting a plurality of batteries 11A, 11B, . . . , 11N in series. Each of the batteries 11A–11N has a well-known structure including a plurality of battery cells. Temperature sensors 4, which detect battery temperatures, are disposed in each of batteries 11A–11N. An electric load 8 is connected across battery device 1 with an electric line 61. A load relay 71 is disposed between electric load 8 and battery device 1 to control the energy supply from battery device 1 to electric load 8. In addition, current sensor 5 is also disposed between electric load 8 and battery device 1.

Individual control circuits 2A, 2B, . . . , 2N are provided, respectively, corresponding to batteries 11A–11N. Individual control circuits 2A–2N have the same structures including a voltage signal generator 21, a temperature signal generator 22, a battery charger 23, and a communication interface (I/F) 24. A pair of charge lines extending from battery charger 23 are connected via a pair of lines 62 and 63 to electrode terminals of the corresponding battery 11A–11N. Voltage signal generator 21 generates a voltage signal in proportion to a voltage across a pair of lines 62 and 63 (i.e., a voltage of the respective one of batteries 11A–11N). Temperature signal generator 22 is connected to the respective temperature sensor 4 and generates a temperature signal in proportion to the battery temperature detected by temperature sensor 4.

Figure 2:
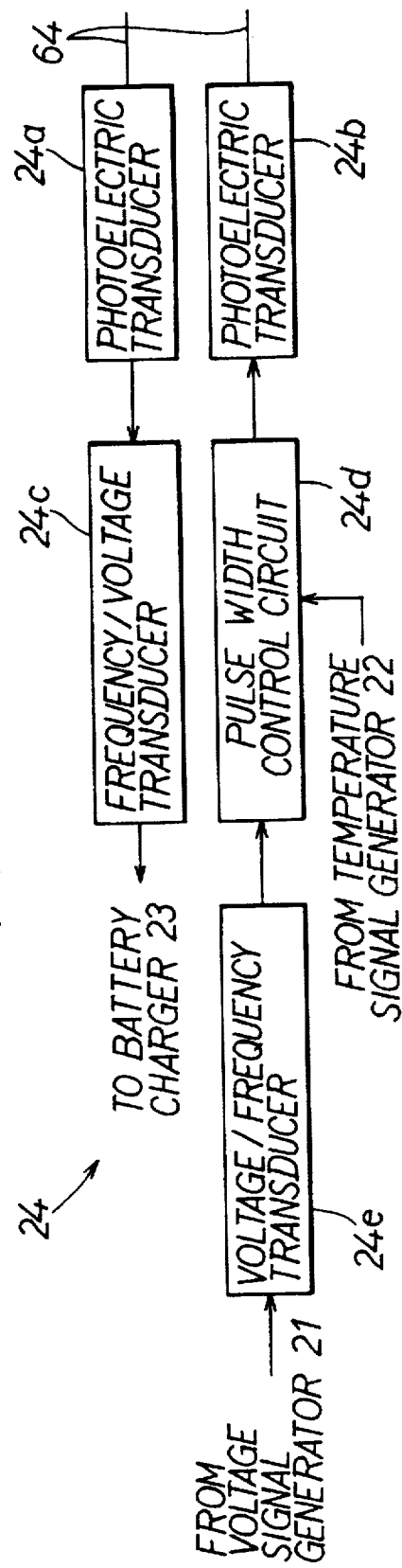
FIG. 2 is a block diagram illustrating a structure of a communication interface 24 in FIG. 1.

As shown in FIG. 2, communication I/F 24 has two photoelectric transducers 24a and 24b, a frequency/voltage transducer 24c, a pulse width control circuit 24d and a voltage/frequency transducer 24e.

Voltage signal generator 21 is connected to voltage/frequency transducer 24e and temperature signal generator 22 is connected to pulse width control circuit 24d. The voltage signal generated by voltage signal generator 21 and temperature signal generated by temperature signal generator 22 are fed to voltage/frequency transducer 24e and pulse width control circuit 24d. Communication I/F 24 generates a voltage-temperature pulse signal which has a frequency that varies in response to the voltage signal from voltage signal generator 21 and a pulse width that varies in response to the temperature signal from temperature signal generator 22. After the voltage-temperature pulse signal is transduced to an optical pulse signal, the optical pulse signal is sent out by photoelectric transducer 24b.

Frequency/voltage transducer 24c is connected to battery charger 23. To charge battery device 1, battery charger 23 is connected to an outside (home or commercial) energy source through a charge relay 72. Photoelectric transducer 24a receives a photo command signal from a main controller 3 and transduces the photo command signal into an electric command signal. After that, the electric command signal is changed at frequency/voltage transducer 24c to a voltage command signal having a voltage corresponding to the frequency of the electric command signal. The voltage signal is fed to battery charger 23 of the respective control circuit 2A–2N. The command signal instructs a charge current. Battery charger 23 controls the charge current supplied to the corresponding battery 11A–11N in response to the command signal.

Communication I/F 24 of each individual control circuit 2A–2N is connected by an optical fiber cable 64 to a communication I/F 31 in the main controller 3. Cable 64 contains a plurality of optical fibers which are respectively wired from the control circuits 2A–2N to the main controller 3.

Figure 3:
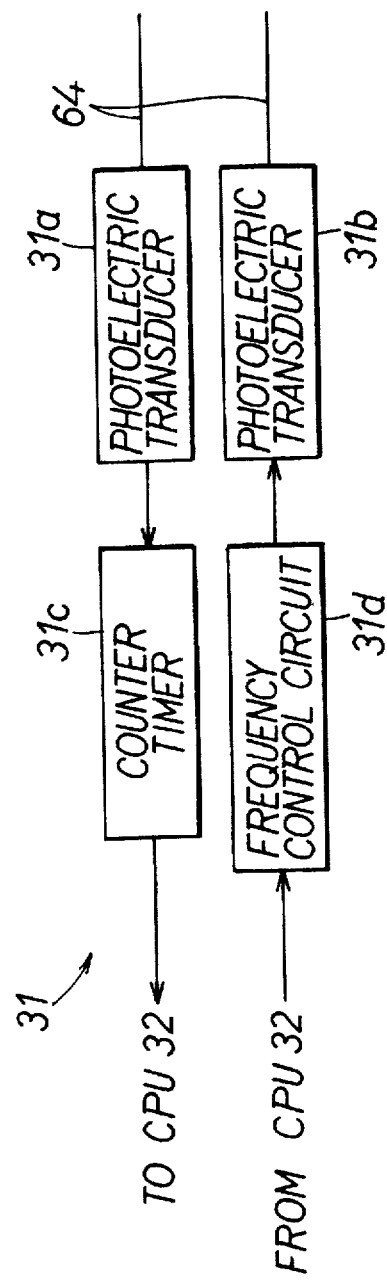
FIG. 3 is a block diagram illustrating a structure of a communication interface 31 in FIG. 1.

As shown in FIG. 3, communication I/F 31 has two photoelectric transducers 31a and 31b, a counter timer 31c and a frequency control circuit 31d. Though not shown, communication I/F 31 contains a set of two photoelectric transducers, a counter timer and a frequency control circuit for each of the control circuits 11A–11N, and each set operates as follows.

The optical voltage-temperature pulse signal is fed to a corresponding photoelectric transducer 31a of communication I/F 31 via cable 64 in order to change to an electric voltage-temperature signal. Counter timer 31c demodulates the electric voltage-temperature pulse signal into the voltage signal and the temperature signal. That is, counter timer 31c measures the frequency and pulse width of the voltage-temperature pulse signal and generates the voltage signal corresponding to the measured frequency and the temperature signal corresponding to the measured pulse width.

A central processing unit (CPU) 32 is included in the main controller 32. CPU 32 is fed the voltage signals and the temperature signals from individual control circuits 2A–2N after demodulation by counter timer 31c. CPU 32 is also fed a current signal from current sensor 5. CPU 32 determines charge currents supplied to batteries 11A–11N as a function of the voltage signals, the temperature signals and the current signal. In addition, CPU 32 calculates the electrical power supplying capacities left in each battery 11A–11N and generates an indication signal, which causes an indicator 33 to indicate a minimum capacity among them, i.e., the capacity of the battery which currently has the least energy supplying capacity.

The charge currents determined by CPU 32 are provided as command signals to frequency control circuits 31d of communication I/F 31, respectively. Frequency control circuit 31d generates a charge pulse signal with frequency in proportion to the digital value of the command signal. The charge pulse signals are transmitted to each control circuit 2A–2N via optical fiber cable 64. Frequency/voltage transducer 24c of each control circuit 2A–2N demodulates the charge pulse signal into the voltage command signal fed to battery charger 23. No special communication protocol is used for communications between main controller 3 and individual control circuits 2A–2N. Accordingly, control circuits 2A–2N do not need to have a CPU, which contributes to lower the cost of the device.

Charging Mode

Figure 4B:
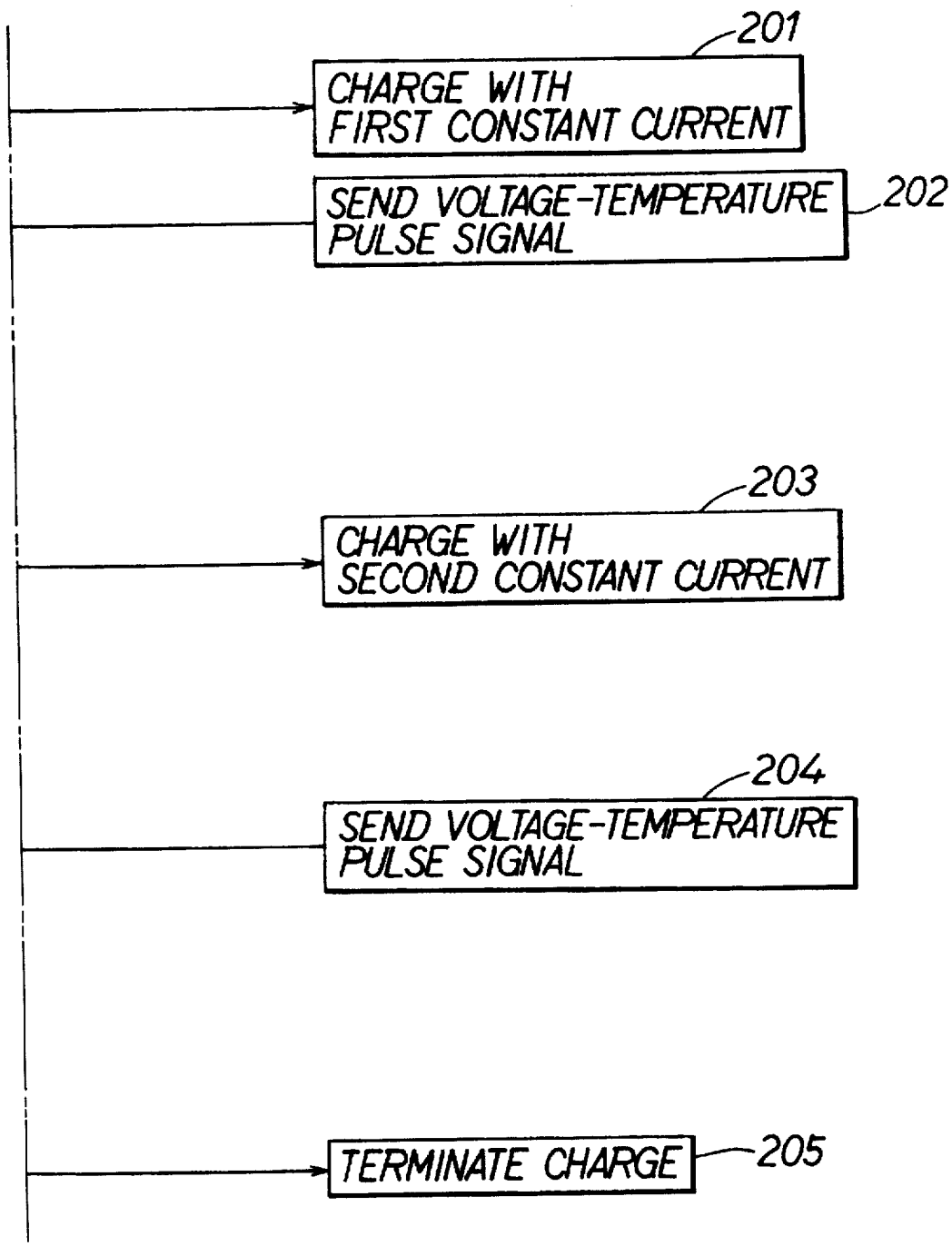
FIG. 4B shows flow charts illustrating the processes performed by individual control circuits of FIG. 1 when a battery device is charged.

FIGS. 4A and 4B show the processes performed by main controller 3 and individual control circuits 2A–2N in detail when battery device 1 is charged by an outside energy source. When a charge switch (not shown) is turned on by an operator, a relay energizing circuit (not shown) opens load relay 71 and closes charge relay 72, which operation puts CPU 32 of main controller 3 into a charge control mode (step 101).

In the charge control mode, CPU 32 sets a charge timer (step 102). All batteries 11A–11N start to be charged at the same time. The charge timer provides the longest charging period of time for batteries 11A–11N. If batteries 11A–11N continue to be charged beyond the longest charging period of time, batteries 11A–11N will be overcharged. Therefore, the charge timer is used for limiting the charging period of time against all batteries 11A–11N so as to avoid the overcharge of the batteries 11A–11N.

Next, CPU 32 sends out charge pulse signals (step 103) to all of the individual control circuits 2A–2N. In individual control circuits 2A–2N, the charge pulse signals are demodulated into voltage command signals to be fed to battery chargers 23. In response to the voltage command signals, battery chargers 23 charge batteries 11A–11N with first constant currents, respectively (step 201). The voltages of batteries 11A–11N gradually go up because of the charges with the first constant currents (See FIG. 6).

Next, steps 104 to 112 executed by main controller 3 will be explained. Steps 104 to 112 are independently processed with regard to each control circuit 2A–2N.

CPU 32 detects a battery voltage and a battery temperature in response to the voltage-temperature pulse signal generated from each control circuit 2A–2N (step 104, step 202). A reference voltage is compensated depending on the detected temperature (step 105) according to the following equation;

reference voltage $V=V0-\alpha(T-T0)$ wherein V0 is a constant value, $\alpha$ is a coefficient, T0 is a constant value and T shows the detected temperature. The reference voltage is a reference value to determine whether a battery is close to full charge (e.g., 80%–90% of full charge). Even if a charge state of a battery does not change, the reference voltage reduces in response to an increase of the battery temperature. Therefore, the reference voltage must be compensated for an accurate determination.

Figure 6:
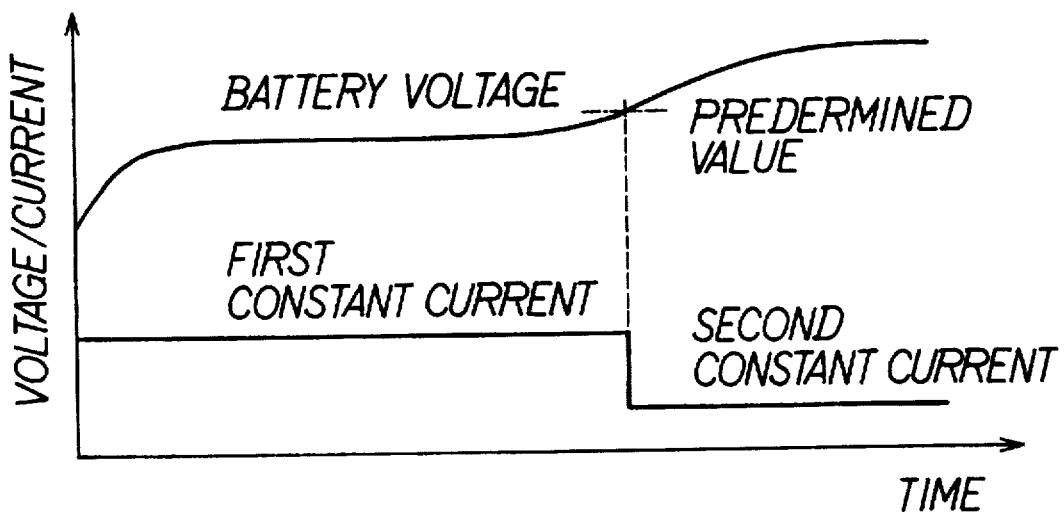
FIG. 6 is a time chart illustrating changes of charge current and battery voltage.

Step 106 determines whether the battery voltage exceeds the reference voltage. When the battery voltage exceeds the reference voltage, main controller 3 provides a second charge pulse signal to the corresponding control circuit 2A–2N (step 107). Further, CPU 32 sets a second charge timer to limit a period of time of supplying a second constant current (step 107). When the second charge pulse signal is fed to control circuits 2A–2N, battery charger 23 charges the corresponding battery 11A–11N with the second constant current (step 203). The second constant current is smaller than the first constant current as shown in FIG. 6. While the second constant current continues to flow, CPU 32 monitors whether the second charge timer exceeds a predetermined time value (step 108). If it does not exceed the predetermined time value, CPU 32 determines the battery temperature and battery voltage based on the voltage-temperature pulse signal transmitted from the respective control circuit 11A–11N (step 109, step 203). Subsequently, an upper limit voltage is compensated as a function of the battery temperature (step 110) with the same manner as the reference voltage.

Step 111 determines whether the battery voltage exceeds an upper limit voltage. When the determination at step 108 or step 111 is affirmative, CPU 32 stops the second charge pulse signal provided to the respective control circuit 2A–2N (step 112). That control circuit 2A–2N then terminates charging the battery whose voltage exceeded the upper limit voltage (step 205).

Main controller 3 terminates the charge control mode when the charge with the second constant current has been completed in regard to all batteries 11A–11N or when the charge timer set to limit a charging period of time against all batteries 11A–11N exceeds a predetermined time value (step 113).

As a modification, if the outside power source has insufficient power to charge all batteries at the same time, the respective period of time for charging each battery 11A–11N may be controlled so that the energy needed for charging battery device 1 does not exceed the maximum energy of the power source. For example, the timing at which each battery 11A–11N begins to be charged is shifted from one to another, or staggered individually or in groups or in any desired manner so that at no time are all of the periods for charging batteries 11A–11N overlapping.

In the charge control mode, as described above, since the voltages of batteries 11A–11N are individually detected, batteries 11A–11N can be optimally charged regardless of characteristic differences among batteries 11A–11N.

Discharging Mode

Figure 5:
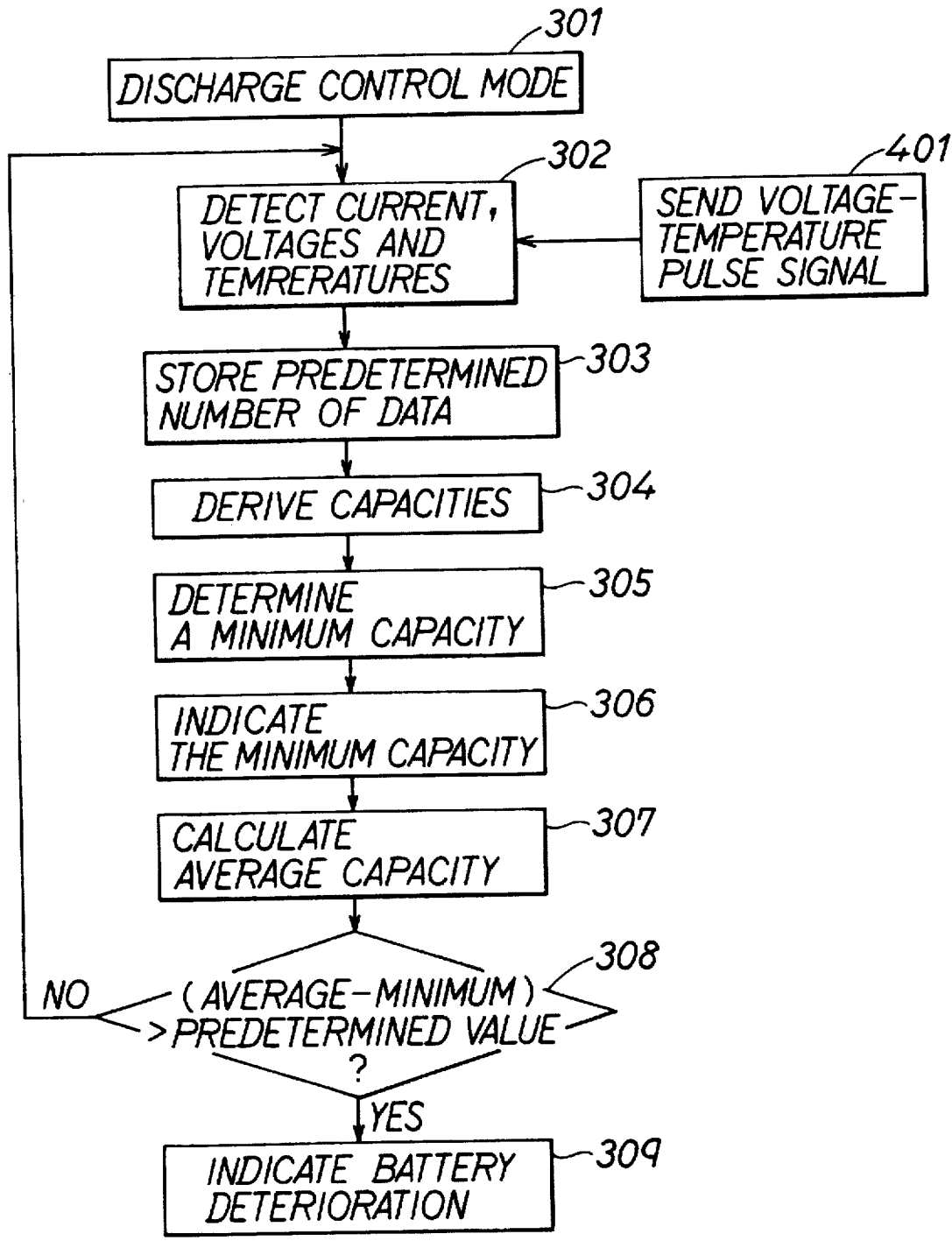
FIG. 5 is a flow chart illustrating the process performed by the main CPU and individual control circuits of FIG. 1 when a battery device is discharged.

Next, FIG. 5 shows the processes performed by main controller 3 and individual control circuits 2A–2N in detail when battery device 1 is being discharged, i.e., used to power load 8. When an electric motor vehicle is powered, a relay energizing circuit (not shown) closes load relay 71 and opens charge relay 72, to put CPU 32 of main controller 3 into a discharge control mode (step 301). CPU 32 detects a discharge current from battery device 1 in response to a current signal from current sensor 5 (step 302) at every predetermined constant interval. CPU 32 also determines the battery voltage and battery temperature for each of the batteries 11A–11N based on voltage-temperature pulse signals transmitted from control circuits 2A–2N in the same manner as described above (step 302) at every predetermined constant interval.

Figure 7:
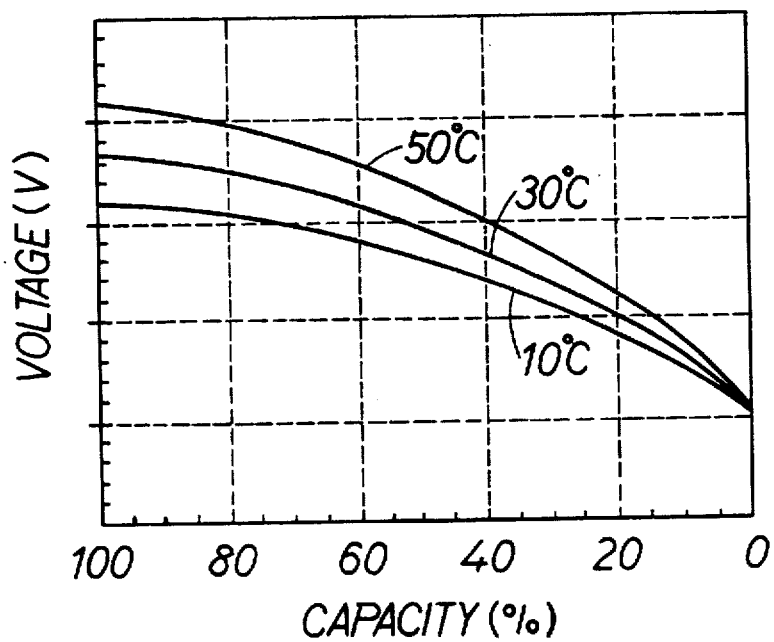
FIG. 7 is a graph illustrating a voltage characteristic under constant energy discharge.

Main controller 3 stores a predetermined number of discharge currents, battery voltages and battery temperatures in regard to each of batteries 11A–11N (step 303). Old data is deleted so that the predetermined number of updated data can be stored. Subsequently, main controller 3 calculates the electrical power supplying capacity (%) left in each battery 11A–11N with reference to a voltage-capacity characteristic, which is stored as a map beforehand. As shown in FIG. 7, the stored map includes a plurality of relationships between a discharge voltage and an electric power supplying capacity, in correspondence to the change of the battery temperature.

The following explains how the electric power supplying capacity is calculated by main controller 3. First, a current-voltage regression formula is calculated to a first degree based on the predetermined number of discharge currents and battery voltages. The discharge current and the battery voltage have a correlation in which the smaller the battery voltage becomes, the larger the discharge current becomes according to a certain gradient. The current-voltage regression formula shows the correlation between the discharge current and the battery voltage. Next, an estimated voltage for each battery 11A–11N under a constant energy discharge is calculated from the current-voltage regression formula.

That is, when an amount of energy needed for driving an electric motor vehicle is determined, a combination of a battery voltage and a discharge current to supply the determined energy can be derived from the current-voltage regression formula. The electric power supplying capacity of each battery 11A–11N is derived with reference to the voltage-capacity characteristic based on the estimated battery voltage and the detected battery temperature (step 304). The voltage-capacity characteristic includes a plurality of relationships (FIG. 7) between a discharge voltage and an electric power supplying capacity when the battery temperature is used as a parameter. However, when the detected battery temperature does not correspond to the temperature used as a parameter, the calculated capacity is compensated by the difference therebetween according to FIG. 7.

After the electric power supplying capacities of batteries 11A–11N have been calculated, the minimum capacity among them is determined and is indicated on indicator 33 (steps 305 and 306). The indication of the minimum capacity urges a driver of the electric motor vehicle to recharge battery device 1 before the battery having the minimum capacity is overdischarged, thereby preventing battery deterioration.

Besides indicator 33, a voice generator (not shown) may be used to inform the driver.

Additionally, when one of the batteries 11A–11N reaches a predetermined minimum desired energy supplying capacity, CPU 32 may generate a detectable signal to energize a warning light or voice generator. Alternatively, the signal may be a continuous one which represents the energy supplying capacity of whichever battery currently has the least energy supplying capacity. Such a continuous signal may be applied to a gauge (not shown) for continuously displaying the current capacity of the battery supplying the least energy, and the gauge itself can have a red-warning area for indicating when the capacity of the least energy supplying battery reaches the predetermined minimum-desired energy supplying capacity. Since the driver can be informed by one of the warning methods that one of batteries 11A–11N has reached the predetermined minimum-desired energy supplying capacity, the driver can take a remedial measure such as recharging battery device 1 before any of batteries 11A–11N is overdischarged.

Main controller 3 also calculates an average capacity of all batteries 11A–11N (step 307). When the indicated battery capacity (that is, the minimum capacity) is smaller by a predetermined value than the average capacity (step 308), main controller 3 determines that the battery with the minimum capacity has deteriorated and indicates that information on indicator 33 (step 309). As a result, the driver can accurately notice when the battery should be exchanged. It is preferable that each battery is given a number and indicator 33 indicates the number of the deteriorated battery.

It should be noted that the function performed by each step in the flow charts shown in FIGS. 4A to 5 can be realized by a respective logic circuit as well.

In the embodiment described, the charge state of a battery is determined based on a battery voltage when the battery is charged. In addition, a discharge state of a battery is determined based on an estimated battery voltage under a constant energy discharge. However, the determination of the charge state and discharge state are not limited to the mode described above. Especially, the discharge state can be determined based on an estimated battery voltage under a constant current discharge.

Still other modifications will occur to those of ordinary skill in the art, and those as well as the disclosed modifications and described embodiment are intended to be included within the scope of this invention as defined by the following claims.

What is claimed is:

1. A charge state detecting device for a battery device comprising:
   a battery device including a plurality of batteries connected in series;
   current detection means for detecting current flowing out of said battery device;
   voltage detection means for detecting a respective battery voltage of each individual battery of said plurality of batteries;
   capacity calculating means for calculating a respective electric power supplying capacity of each individual battery of said plurality of batteries based on said current and said respective battery voltage of each individual battery of said plurality of batteries; and
   capacity determination means for determining a minimum capacity among said respective electric power supplying capacities of each individual battery of said plurality of batteries and for setting said minimum capacity as an overall electric power supplying capacity of said battery device.

2. A charge state detecting device as claimed in claim 1, wherein said capacity calculating means includes:
   regression formula calculating means for calculating a current-voltage regression formula based on said current and said battery voltage;
   voltage estimating means for calculating an estimated battery voltage for each of said plurality of batteries based on a constant discharge and on said current-voltage regression formula; and
   storing means for storing voltage-capacity characteristics;
   wherein said capacity calculating means calculates said electric power supplying capacity of each of said plurality of batteries with reference to said voltage-capacity characteristic, based on said estimated battery voltages.

3. A charge state detecting device as claimed in claim 1, wherein said battery device is adapted to supply electric power to an electric load, said overall capacity set by said capacity determination means indicating the capacity of said battery device to supply electric power to said electric load.

4. A charge state detecting device as claimed in claim 2, wherein said constant discharge is a constant energy discharge.

5. A charge state detecting device as claimed in claim 2, wherein said storing means stores a plurality of relationships between discharge voltage and electric power supplying capacity, said plurality of relationships respectively corresponding to a plurality of battery temperatures.

6. A charge state detecting device as claimed in claim 5, further comprising:
   means for detecting a battery temperature of each of said plurality of batteries;
   compensating means for compensating said electric power supplying capacity calculated by said capacity calculating means by a difference between said detected battery temperature and one of said plurality of battery temperatures.

7. A charge state detecting device as claimed in claim 1, further comprising:
   a detectable signal producing device for producing a detectable signal corresponding to said minimum capacity.

8. A charge state detecting device as claimed in claim 1, further comprising;
   average capacity calculating means for calculating an average capacity of all batteries and deterioration determination means for determining battery deterioration when a capacity of any battery of said battery device is smaller by a predetermined value than said average capacity.

9. A charge state detecting device as claimed in claim 1, further comprising:
   a plurality of chargers connected to said plurality of batteries, respectively, for individually charging said plurality of batteries until battery voltage of each of said plurality of batteries reaches an upper limit.

10. A charge state detecting device as claimed in claim 9, wherein said plurality of chargers includes means for charging said plurality of batteries with a predetermined current, respectively, until the voltage of each of said plurality of batteries reaches a predetermined voltage value and with a current smaller than said predetermined current, respectively, within a range from said predetermined value to said upper limit.

11. A charge state detecting device as claimed in claim 9, further comprising;
   charging period control means for controlling battery charging time periods for said plurality of batteries so that an energy which is necessary to charge said battery device does not exceed a predetermined energy at any one time.

12. A charge state detecting device as claimed in claim 9, further comprising;
   charging period limiting means for limiting battery charging time period for all of said plurality of batteries to a predetermined time period when said plurality of batteries are started to be charged at the same time.

13. A charge state detecting device as claimed in claim 10, further comprising;
   voltage value compensating means for compensating said predetermined voltage value in response to a change of battery temperature.

14. A charge state detecting device as claimed in claim 10, further comprising;
   current flowing time limiting means for limiting a time period for charging with said current to a predetermined time period.

15. A charge state detecting device as claimed in claim 10, further comprising;
   upper limit compensating means for compensating said upper limit in response to a change of battery temperature.

16. A charge state detecting device for a battery device including a plurality of batteries, said charge state detecting device comprising:
   an interface that receives detected values relating to a capacity of each of said plurality of batteries to supply electric power;
   a controller that calculates a plurality of remaining capacity values for each of said plurality of batteries, respectively, based on said detected values, and determines which of said batteries have the least remaining capacity to supply electric power.

17. A charge state detecting device as claimed in claim 16, wherein said battery device is adapted to supply electric power to an electric load, said controller setting an overall capacity of said battery device to supply electric power to said electric load based on said determination of which of said batteries has the least remaining capacity to supply electric power.

18. A rechargeable device for supplying electric power to a load, comprising:
- a battery device including a plurality of batteries connected in series together;
- sensors that detect electrical parameters of each of said batteries of said battery device; and
- a controller coupled to said sensors that determines a plurality of remaining capacity values for each of said plurality of batteries, respectively, based on said detected electrical parameters, and determines which of said plurality of batteries have the least remaining capacity for supplying electric power based on said remaining capacity values.

19. A charge state detecting device as claimed in claim 18, wherein said battery device is adapted to supply electric power to said load, said controller setting an overall capacity of said battery device to supply electric power to said load based on said determination of which of said batteries has the least remaining capacity for supplying electric power.

20. A rechargeable device according to claim 18, further comprising:
- a plurality of chargers respectively coupled to said plurality of batteries, that individually charge each of said plurality of batteries in accordance with charging time periods set by said controller.

* * * * *